United States Patent [19]
Langer et al.

[11] Patent Number: 5,582,876
[45] Date of Patent: Dec. 10, 1996

[54] STEREOGRAPHIC APPARATUS AND METHOD

[75] Inventors: Hans J. Langer, Gräfelfing; Johann Oberhofer, Unterschleissheim, both of Germany

[73] Assignee: EOS GmbH Optical Systems, Planegg, Germany

[21] Appl. No.: 357,781

[22] Filed: Dec. 16, 1994

Related U.S. Application Data

[63] Continuation of Ser. No. 75,453, filed as PCT/EP92/02376, Oct. 14, 1992 published as WO93/08506, Apr. 29, 1993, abandoned.

[30] Foreign Application Priority Data

Oct. 16, 1991 [DE] Germany ............ 41 34 265.8

[51] Int. Cl.$^6$ ..................... C08J 7/04
[52] U.S. Cl. ............... 427/492; 427/498; 427/510; 427/504; 427/512; 264/401
[58] Field of Search ............... 427/492, 498, 427/504, 510, 512; 118/620, 56, 600, 101, 120, 242, 413, 428; 264/401

[56] References Cited

U.S. PATENT DOCUMENTS

| | | | |
|---|---|---|---|
| 3,030,917 | 4/1962 | Brown et al. | 118/413 |
| 3,735,733 | 5/1973 | Henc | 118/261 |
| 4,246,335 | 1/1981 | Keogh et al. | 427/358 |
| 4,331,099 | 5/1982 | Topfer | 118/413 |
| 5,014,207 | 5/1991 | Lawton | 364/468 |
| 5,139,711 | 8/1992 | Nakamura et al. | 427/512 |
| 5,174,931 | 12/1992 | Almquist et al. | 427/512 |
| 5,474,719 | 12/1995 | Fan et al. | 427/512 |
| 5,503,793 | 4/1996 | Uchinono et al. | 427/512 |

FOREIGN PATENT DOCUMENTS

| | | |
|---|---|---|
| 0171069A3 | 2/1986 | European Pat. Off. |
| 0250121A2 | 12/1987 | European Pat. Off. |
| 0361847A2 | 4/1990 | European Pat. Off. |
| 0362982A2 | 4/1990 | European Pat. Off. |
| 0388129A2 | 9/1990 | European Pat. Off. |
| 0393676A1 | 10/1990 | European Pat. Off. |
| 0429196A2 | 5/1991 | European Pat. Off. |
| 0450762A1 | 10/1991 | European Pat. Off. |
| 0459635A1 | 12/1991 | European Pat. Off. |
| 3931793A1 | 3/1990 | Germany |
| 61-114818 | 5/1986 | Japan |
| WO90/03255 | 4/1990 | WIPO |
| WO92/08200 | 5/1992 | WIPO |

OTHER PUBLICATIONS

Hido Kodama; Nagoya Municipal Ind. Research Inst., 3–24 Rokuban–cho, Nagoya 456, Japan; *Rev. Sci. Instrum.* 52(11), Nov. 1981; 1981 Amer. Inst. of Physics; pp. 1770–1773 "Automatic method for fabricating a three–dimensional plastic model with photo–hardening polymer."
International Search Report.

*Primary Examiner*—Marianne Padgett
*Attorney, Agent, or Firm*—George W. Neuner

[57] ABSTRACT

An apparatus for producing an object using stereography is disclosed. The apparatus has a bath of liquid material in a container, the bath having a free surface. A support in the container supports and positions the object relative to the surface. A means for applying electromagnetic radiation solidifies a layer having solidified sections of the material. A wiper extends across the surface in a first direction. The wiper is at least partly formed of a flexible material and has a substantially horizontal lower edge, and it is positioned below the free surface of the bath in a working position. Displacement means displaces the wiper in the working position in a second direction substantially transversely to the first direction to move a portion of the liquid material in the bath. The lower edge of the wiper is flexibly yielding so as to apply a thin film of liquid material on a surface of the solidified layer and liquid material between solidified sections when displacing the wiper in the second direction.

2 Claims, 1 Drawing Sheet

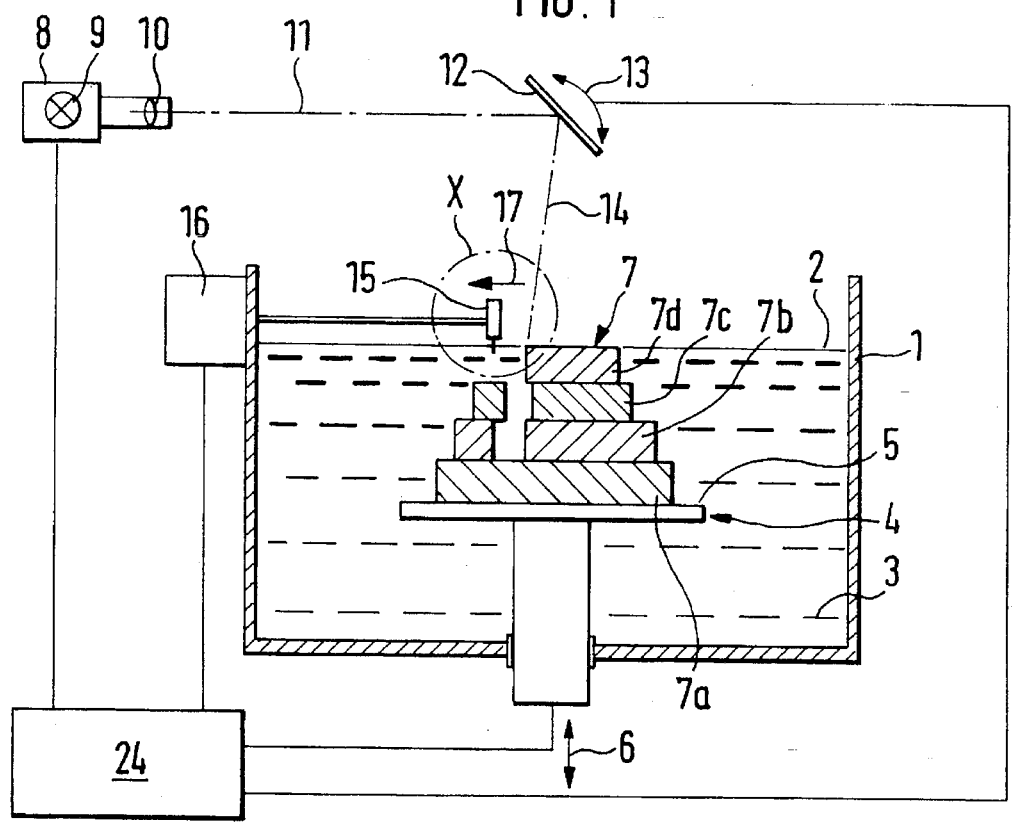
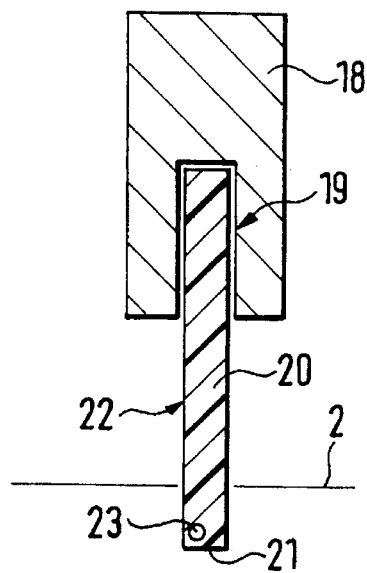
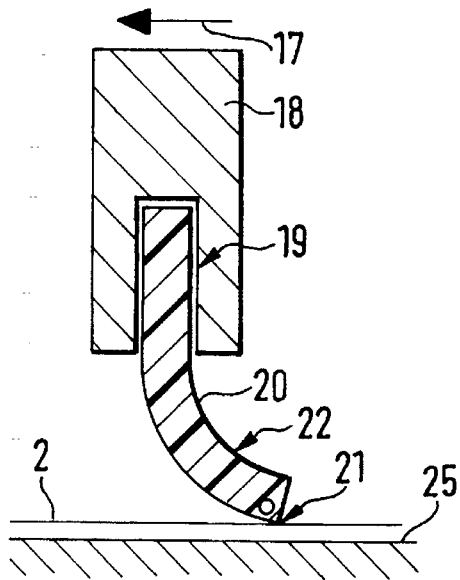

STEREOGRAPHIC APPARATUS AND METHOD

This is a continuation of application Ser. No. 08/075,453 filed as PCT/EP92/02376, Oct. 14, 1992 published as WO93/08506, Apr. 29, 1993, abandoned, and International application PCT/EP92/02376 filed on Oct. 14, 1992 and which designated the U.S.

FIELD OF THE INVENTION

The invention relates to an apparatus and method for a production of a three-dimensional object by means of stereography.

DESCRIPTION OF RELATED ART

An example for such a method which is known as "stereography" is described in the paper of Hideo Kodama, "Automatic method for fabricating a three-dimensional plastic model with photo-hardening polymer", Rev. Sci. Instrum. 52(11), Nov. 1981, pages 1770 to 1773. After solidifying a layer the object is lowered so as to form on top of the solidified layer a liquid layer of a resin material which is thereafter solidified in correspondence to the object to be fabricated under the influence of electromagnetic radiation. However, the thickness of this initially liquid layer which represents the layer thickness of the following layer and therefore substantially determines the manufacturing accuracy can not be exactly adjusted and depends on the velocity of the liquid resin flowing onto the solidified layer when lowered and of a possible surplus amount flowing off again. The layer thickness is therefore not exactly defined and additionally a considerable time is necessary, dependent on the viscosity of the resin, for adjusting a desired thickness.

In order to reduce this time the EP-A-0 171 069 proposes to initially lower the solidified layer to an extent greater than required and thereafter rise the same to the final position. However, the problem of the inaccurate layer thickness can not be solved in this manner. To this end the EP-A-0 361 847 proposes to use a blade for striking off excess resin material and for accurately adjusting the layer thickness. However, it has turned out that the known blade tends to amplify local disturbances in particular when used in connection with thin layers having a layer thickness of 0.1 mm or less. In particular, when fabricating parts having a closed volume where a rigid border encloses a liquid interior an inclined edge is slowly built up which may finally even project from the bath and strike the blade so that the blade is brought out of alignment or the object or the blade might even be damaged. Especially with those parts having closed volumes it has further been shown that the surface projects beyond the rigid border even after the striking-off and that therefore no accurate layer thickness is obtained when changing the form of the border. Finally, this known striking method normally requires to lift the surface of the solidified layer beyond the surface of the liquid resin bath, thereby causing the danger of including air bubbles in the object.

It is therefore the object of the invention to accelerate the manufacture of the object and to improve the accuracy and quality in producing the object.

SUMMARY OF THE INVENTION

In accord with the present invention, an apparatus for producing an object by means of stereography comprises a container (1) receiving a bath of liquid or powdered material (3) which can be solidified by influence of electromagnetic radiation, a support (4) for positioning the object relative to the surface (2) of the bath and means (8) for solidifying a layer of the material (3) at the surface using electromagnetic radiation. The apparatus has a wiper (15) which is displaceable across the surface (2) of the bath, the lower end of the wiper facing the surface of the bath being formed to flexibly yield in a direction opposite to the direction of displacement.

The invention also comprises a method for producing an object by means of stereography wherein the object is solidified layer by layer within a bath of liquid material which can be solidified using electromagnetic radiation. In the method, the following steps are carried out for each layer: (a) initially first regions of a layer are solidified, wherein second regions comprising liquid material remain between these first regions; (b) at least the second regions are coated with a film of liquid material such that the layer thickness at the second regions is larger than the layer thickness at of the solidified first regions by an amount which preferably substantially corresponds to the extent of shrinkage; and (c) thereupon the layer is solidified at the second regions.

Further embodiments of the invention are characterized in the subclaims.

BRIEF DESCRIPTION OF THE DRAWINGS

An embodiment of the invention will be described in the following in connection with the Figures. In the Figures FIG. 1 shows a schematic elevation of an embodiment of the apparatus according to the invention;

FIG. 2 shows an enlarged sectional view of an inventive wiper according to detail X in FIG. 1 in rest position; and FIG. 3 shows the wiper of FIG. 2 in operation.

DESCRIPTION OF THE PREFERRED EMBODIMENTS

A container 1 having an open top is filled with a light-curable liquid resin material 3 up to a level or surface 2, resp. A support 4 having a substantially plane and horizontal support platform 5 is arranged inside the container within the resin 3 and the support platform 5 is arranged parallel to the surface 2 and can be displaced and positioned up and down in a direction perpendicular to the surface 2 or to the support platform 5, resp., by means of a schematically shown displacement or elevation adjustment means 6.

The support platform 5 supports the object 7 which is composed of a plurality of layers 7a, 7b, 7c and 7d each extending parallel to the surface 2 and to the support platform 5 in a manner described further below.

A solidifying apparatus 8 for solidifying the uppermost layer 7d adjacent to the surface comprises an illumination apparatus 9 having a light source which generates a focussed beam 11 through an optical system 10. A deviation mirror 12 is mounted on gimbals substantially centrally above the container 1 and can be pivoted by a schematically shown pivoting mechanism 13 so as to position the focussed beam 11 directed to the mirror 12 and being reflected therefrom as reflected beam 14 at substantially any point of the surface 2. Alternatively two rotating mirrors, one for each coordinate direction, may be used in conventional manner.

A wiper 15 which is schematically shown in FIG. 1 and extends substantially transversely across the open upper portion of the container 1 is arranged at the open top of the container 1 and coupled to a displacement mechanism 16 for displacing the wiper 15 in a horizontal plane across the surface 2 in a direction 17 substantially perpendicular to the extension of the wiper 15. The wiper shown in section in FIG. 2 comprises a rigid rail 18 having a groove 19 with a flexible member 20 inserted therein at its lower side facing the surface 2. In the shown embodiment the member has the shape of a thin rectangular rubber profile put on end and having the upper edge thereof inserted into the groove 19. The substantially horizontal lower edge 21 of the rectangular profile is positioned within the range of 2 to 10 mm, preferably 3 to 5 mm below the lower side of the rail 18 and dips into the material 3 to a predetermined extent, preferably about 0.5 mm, in the rest position shown in FIG. 2. However, any other profile and any other material may be used which permits a lateral excursion of the lower edge 21 or a deformation of the clear part 22 of the member 20 relative to the rail 18 transversely to the direction of displacement 17 when laterally displacing the wiper in direction 17. The member 20 may for example be formed as a plurality of separate adjacent flexible individual members or even as a broad brush with the individual members being the individual brush hairs.

A heating element 23 is integrated within the member 20 close to the lower edge 21 thereof and connected with a (not shown) voltage supply for controlled power supply thereof.

The displacement mechanism 16 is adapted to permit an adjustable and variable displacement velocity of the wiper 15.

A processor 24 is connected to the illumination apparatus 9, to the pivoting mechanism 13, to the elevation adjustment means 6 and to the displacement mechanism 16 for carrying out the steps described below.

In operation initially data defining the shape of the object 7 are generated or stored, resp., within the processor 24 on the basis of a design program or the like. These data are treated for the manufacture of the object 7 in such a manner that the object is split up into a large number of horizontal layers which are thin compared to the dimension of the object and each have a thickness of e.g. 0.1 (or even less) to 1 mm, and the form data for each layer are made available.

The container is thereupon filled with resin material 3 to such an extent that the free surface 2 of the liquid bath is above the lower edge 21 of the wiper. The extent to which the wiper 15 with the flexible member 20 thereof enters the resin is selected so as to guarantee that in operation roughnesses of the surface 2, in particular those existing after lowering the object after solidification of a layer, are above the lower edge 21. However, the entering depth also depends on the viscosity of the material 3 and on the elasticity of the member 20 and exerts an influence on the layer thickness to be obtained, so that the optimum value must be determined in every case individually. Practically the entering depth is between 0.2 and 1 mm, preferably around 0.5 mm.

In order to fabricate the first layer 7a the processor 24 now controls the elevation adjustment means 6 such that the upper side of the support platform 5 is lifted to a predetermined elevation below the surface 2 or below the lower edge 21, resp., corresponding to the thickness of the layer 7a. This elevation can but need not necessarily be selected such that a distance corresponding to the predetermined thickness of the first layer 7a exists between the upper surface of the support platform 5 and the previously adjusted level of the surface 2.

Owing to the movement of the support platform 5, however, the surface 2 is no longer flat, but for example slightly higher in the center because of the lateral flow of the resin 3 from the region above the support platform. In order to accelerate the formation of a plane surface 2 the processor 24 therefore controls the displacement mechanism 16 so as to displace the wiper 15 horizontally across the surface 2 at a predetermined velocity. The flexible member 20 is thereby deformed towards the side opposite to the displacement direction in the manner shown in FIG. 3 and thereby smoothes out the roughnesses in the manner of a soft spattle or brush and simultaneously accurately adjusts the thickness of the liquid resin layer by cooperation of the surface 25 and the terminal region of the member 20 which more or less nestles to the surface 25 in the manner shown in FIG. 3. This adjustment of the thickness is preferably made by selection of the displacement velocity of the wiper 16, but also depends on the viscosity of the resin 3, the elasticity of the member 20 and the distance between the surface 25 of the previously solidified layer and the lower edge 21 of the wiper 15. When correctly adjusting these parameters a plane coating of liquid material 3 is formed directly behind the wiper 15. A corresponding relation in the form of an empirically determined table or equation may be stored to this end in the processor 24.

Voltage may additionally be applied to the heating element when displacing the wiper 16 so that a control and further accelerated adjustment of the desired layer thickness is obtained by corresponding local warming of the resin.

After the layer thickness has been adjusted in this manner the processor 24 controls the illumination apparatus 9 and the pivoting mechanism 13 such that the reflected beam 14 strikes those points of the liquid resin layer which correspond to the form data generated and treated within the processor 24 and causes a solidification by a polymerization at those points in known manner. Preferably the displacement of the wiper 15 and the control of the beam 14 can be carried out simultaneously in such a manner that the beam follows the wiper 15 and strikes the resin layer within the region immediately behind the wiper (seen in the direction of movement thereof) so that the resin layer is solidified or cured immediately after adjusting the layer thickness thereof.

After the manufacture of the first layer 7a the processor lowers the elevation adjustment means 6 by the amount of the predetermined thickness of the next layer 7b. Liquid resin therefore flows onto the solidified regions of the first layer 7a from the sides so that no uniform layer thickness is initially obtained. To this end the wiper 15 is again moved across the surface 2 and the smoothing-out effect thereof again generates a liquid layer having a constant thickness which is predetermined as a function of the above-mentioned parameters. In the case that the first layer 7a forms a closed border enclosing a liquid volume the wiper 15 at the same time causes a slight lowering of the surface in the region of the liquid volume, as compared with an upward projection thereof beyond the surface at the border as noted when using rigid wipers. Subsequently to or simultaneously with this adjustment of the layer thickness the solidification is carried out in the same manner as with the first layer 7a. The further layers are then produced in an analogous manner.

The movement of the wiper 15 can be controlled so as to lift the wiper after each wiping action and to move it back into the starting position at one side of the container 1. Alternatively the displacement direction of the wiper 15 may alternate at each successive layer so that there is no need for lifting and returning into the starting position. In this case the flexible member 20 such as the rectangular profile shown in the FIGS. 2 and 3 must, of course, permit an excursion or deformation, resp., to both sides thereof.

In accordance with the invention a particularly preferable application of the wiper is in the method of claim 10. In this method the solidification of a layer or the connection to a previous layer therebelow is not carried out in a uniform manner over the entire layer, but only at defined first regions so that between those solidified first regions there remain respective second regions of liquid material 3 which are solidified in a subsequent operation. This reduces the deformation of the object owing to the shrinkage of the material when solidified. However, this method produces an uneven surface. This unevenness is eliminated by using the flexible wiper for "smoothly" applying a thin film of liquid material onto the partly solidified layer after the solidification of the first regions and before the solidification of the second regions so that the layer thickness at the second regions is larger than the already solidified layer thickness at the first regions by an amount corresponding to this shrinkage of the material. Thereafter the second regions are solidified, whereby the surface thereof sinks preferably to the level of the surface of the first regions due to shrinkage thereof. As an example only every second scanning point of a layer is gridwise solidified in a first operation. Owing to the shrinkage of the material the surface 2 is lowered for example in the second regions between these points or first regions, resp. The coating action of the wiper 15 lifts the surface at these second regions above that of the solidified surface of the first regions by an amount corresponding to the shrinkage and a solid layer having a substantially even surface is generated by means of an aimed solidification only at these second regions or points. This method may, of course, be carried out with any number whatsoever of subsequent partial solidifications.

Various modifications of the described apparatus are possible. For example, resin or metal powder can be used in place of the liquid resin 3 and solidified by light or laser action (laser sintering). The solidification of the material can be achieved, dependent on the properties thereof, by means of other types of electromagnetic radiation or heat. The level of the surface 2 of the resin may be lifted together with the wiper 15 correspondingly rather than lowering the support platform 5 after each layer.

Any flexible member suitable for coating, such as a rubber lip or a brush strip may be used as wiper 15. It is further possible to use a rigid rail which is supported so as to resiliently swing around a pivot axis extending in longitudinal direction of the wiper 15, whereby the flexibility is caused by a corresponding resilient lateral excursion of the lower edge 21. In this case, however, the smooth coating effect is not as distinct as with an in itself flexible material which nestles to the solid surface of the preceding layer in a continuous curvature. This material may be mounted in any suitable manner to the rigid rail 18, for example by gluing to the lower side, the front side or back side thereof.

Furthermore, the wiper can be provided with an antifriction coating or can be made of a material which poorly adheres to the resin material 3. Finally, it is also possible to mount the scanner consisting of the illumination apparatus 9 and the deflection mirror 12 at the wiper 15 or to couple the scanner with the displacement mechanism 16 so that only a deflection of the beam 11, 14 transversely to the displacement direction 17 is necessary.

We claim:

1. A method for producing an object layer by layer within a bath of liquid material, said method comprising the following steps in production of each layer;

a) initially solidifying from said liquid material in one or more first regions of a first layer using electromagnetic radiation so that one or more second regions comprising said liquid material in unsolidified form remain in contact with said first regions, said second regions having a first thickness of said liquid material;

b) applying more of said material to said second regions in such manner to increase said first thickness of said material to a second thickness at said second regions by an amount substantially equal to the extent of shrinkage of said material when solidified; and c) solidifying from said liquid material at said second regions using said electromagnetic radiation, thereby generating a solid layer having a substantially even surface over both first and second regions.

2. A method for producing an object layer by layer within a bath of liquid material, said method comprising the following steps in production of each layer;

a) initially solidifying from said liquid material in one or more first regions of a first layer using electromagnetic radiation so that one or more second regions comprising said liquid material in unsolidified form remain in contact with said first regions, said second regions having a first thickness of said liquid material;

b) applying more of said material to said second regions in such manner to increase said first thickness of said material to a second thickness at said second regions by an amount substantially equal to the extent of shrinkage of said material when solidified; and c) solidifying from said liquid material at said second regions using said electromagnetic radiation, thereby generating a solid layer having a substantially even surface over both first and second regions, further comprising applying said material in step b) by displacing a wiper means having a member made at least partly of a rubber material cross said first and second regions while the rubber material member is partially in the liquid bath.

* * * * *

UNITED STATES PATENT AND TRADEMARK OFFICE
CERTIFICATE OF CORRECTION

PATENT NO. : 5,582,876
DATED : December 10, 1996
INVENTOR(S) : Langer, et. al.

It is certified that error appears in the above-indentified patent and that said Letters Patent is hereby corrected as shown below:

Title page, item [73], Assignee: should read--EOS GmbH Electro Optical Systems--.

Signed and Sealed this

Sixth Day of May, 1997

Attest:

BRUCE LEHMAN

*Attesting Officer*      *Commissioner of Patents and Trademarks*